United States Patent [19]

Reichmann

[11] Patent Number: 5,773,500
[45] Date of Patent: Jun. 30, 1998

[54] FLAME RETARDANT HIGH TEMPERATURE POLYPHTHALAMIDES HAVING IMPROVED THERMAL STABILITY

[75] Inventor: Mark G. Reichmann, Roswell, Ga.

[73] Assignee: Amoco Corporation, Chicago, Ill.

[21] Appl. No.: 826,870

[22] Filed: Mar. 26, 1997

Related U.S. Application Data

[60] Provisional application No. 60/017,615 May 14, 1996.
[51] Int. Cl.[6] .................................................... C08K 3/10
[52] U.S. Cl. ................................. 524/410; 524/417
[58] Field of Search ................................. 524/410, 417

[56] References Cited

U.S. PATENT DOCUMENTS

| | | | |
|---|---|---|---|
| H1030 | 3/1992 | Notorgiacomo . | |
| Re. 34,447 | 11/1993 | Poppe et al. ............................. | 524/606 |
| 4,012,445 | 3/1977 | Priest ....................................... | 528/49 |
| 4,111,203 | 9/1978 | Theeuwes ................................ | 128/260 |
| 4,163,101 | 7/1979 | Schade et al. .......................... | 528/347 |
| 4,788,244 | 11/1988 | Nakahashi et al. .................... | 524/469 |
| 4,831,108 | 5/1989 | Richardson et al. ................... | 528/335 |
| 5,085,807 | 2/1992 | Okamoto ................................. | 252/609 |
| 5,112,685 | 5/1992 | Rashbrook et al. .................... | 428/364 |
| 5,115,010 | 5/1992 | Sakai et al. ............................. | 524/410 |
| 5,256,718 | 10/1993 | Yamamoto et al. .................... | 524/411 |
| 5,302,723 | 4/1994 | Petit ........................................ | 548/437 |
| 5,434,232 | 7/1995 | Petit ........................................ | 526/262 |
| 5,543,452 | 8/1996 | Nakahashi ............................... | 524/410 |
| 5,614,578 | 3/1997 | Dong ....................................... | 524/377 |

FOREIGN PATENT DOCUMENTS

| | | |
|---|---|---|
| 309095 | 3/1989 | European Pat. Off. . |
| 0333457 | 9/1989 | European Pat. Off. . |
| 9518178 | 7/1995 | WIPO . |

*Primary Examiner*—Paul R. Michl
*Attorney, Agent, or Firm*—Thomas E. Nemo; Stephen L. Hensley

[57] ABSTRACT

The thermal stability of flame retardant, high temperature polyamides containing an organohalogen flame-retardant such as brominated polystyrene in combination with an antimony compound such as sodium antimonate during molding and similar melt fabrication operations is markedly improved when further combined with a minor amount of calcium oxide. The thermal stability of these compositions are much improved over analogous flame retardant polyamides formulated with magnesium oxide and/or zinc oxide.

18 Claims, No Drawings

FLAME RETARDANT HIGH TEMPERATURE POLYPHTHALAMIDES HAVING IMPROVED THERMAL STABILITY

This application claims the benefit of U.S. provisional application No. 60/017,615, filed May 14, 1996.

BACKGROUND OF THE INVENTION

This invention is directed to a flame retardant high temperature polyamide composition having good heat resistance, and more particularly to a fire-retardant high temperature polyamide composition having markedly improved thermal stability, particularly during molding or other melt fabrication and to a method for improving the thermal stability of flame retardant high temperature polyamide formulations.

The trend toward integration of electronic components has led to an increasing need for plastic materials having much greater heat resistance and flame retardant properties, particularly for use in circuit boards, semiconductor packages and the like. Particularly where such devices are used continuously they may encounter extremely high temperatures, and hence further improvements in heat resistance and flame retardant properties are continually sought by the industry.

Partially aromatic polyamides typified by polymers comprising hexamethylene diamine terephthalamide units have excellent mechanical strength, rigidity, heat resistance, and moisture resistance. These polyamides are finding wide acceptance for use as engineering plastics particularly in applications where elevated temperatures and severe environments may be encountered, including for example electrical appliance parts, connectors and similar parts for electrical and electronic devices and in a variety of automotive applications. Where further improvement in heat resistance and rigidity is required, filled compositions comprising such polyamides in combination with reinforcing fillers such as glass fibers may also be useful. Polyamides composed of aromatic dicarboxylic acids such as terephthalic acid and aliphatic alkylenediamines have long been known, as shown, for example in U.S. Patent RE 34,444. These polyamides have excellent mechanical strength, rigidity and moisture and heat resistance, and are particularly desirable in these applications.

Like most other thermoplastic resins, polyamides are subject to burning. When the polyamide is to be used in applications requiring self-extinguishing characteristics and flame retardant properties it is necessary to resort to the addition of a fire retardant.

Adding halogen-containing organic compounds such as a halogenated polystyrene or a condensation product of brominated phenol to thermoplastics for fire-retarding purposes is known in the art. Additional components, particularly antimony-containing compounds, are widely used in combination with halogen-containing organic compounds, and particularly with bromine-containing flame retardants as an aid to further enhance their effectiveness. These flame retardant formulations have been widely adapted by the art for use in combination with a great variety of polyamides. The further addition of reinforcing fillers such as glass fibers is also well-known in the art.

Flame retardants are intended to decompose under combustion conditions, hence most have limited thermal stability at elevated temperatures. High performance thermoplastics, for example aromatic polyesters and high temperature polyamides, are necessarily compounded at elevated temperatures, often at temperature well above the decomposition temperatures of many fire retardants such as, for example, the combination of a halogen-containing organic compound with antimony oxide. The fire retardant thus may decompose thermally during compounding or melt fabrication operations, resulting in foaming or generation of corrosive by-products that may corrode the processing equipment. Strand-foaming and significant discoloration of pellets are also among the problems commonly encountered when compounding and molding flame retardant high temperature polyamide formulations.

Further problems may occur when the flame-retardant polyamide resin is used continuously in an injection molding operation and over a long period of time, continually generating decomposition products that become deposited on the mold or in vents. The problem, commonly termed "plate-out", may cause staining or discoloration in the molded product as well as blocking of vents and possible corrosion in the processing equipment. In order to avoid these difficulties it then becomes necessary to stop the molding operation at regular intervals and clean the mold and associated processing equipment.

The art has thus continued to seek out other solutions for these problems, and more particularly to look for ways to prevent or at least minimize decomposition during molding. The use of bromine-containing flame retardants in combination with sodium antimonates for flame retarding polyesters has long been known to provide more stable formulations. Similar improvement is seen for polyterephthalamides, particularly when used in combination with further adjuvants. A hydrotalcite-type complex hydroxide or an oxide of magnesium or zinc may be required for formulations comprising polyamides to adequately inhibit decomposition and maintain color in molded articles. See U.S. Pat. No. 5,115,010.

The use of bromine-compounds as flame retardants in combination with antimony trioxide and a styrene-maleic anhydride copolymer are disclosed for use with aliphatic polyamides including nylon 6,6 in U.S. Pat. No. 4,788,244. These and other brominated flame retardants have also been employed for flame retarding high temperature polyamides, alone and in combination with an amine-type stabilizer or a phosphorus-type stabilizer. See U.S. Pat. No. 5,256,718.

The art-recognized flame retardants have not been completely successful in avoiding decomposition when used in combination with partially aromatic copolyphthalamides. Plate-out, and corrosion of processing equipment when melt fabricating these resins, as well as severe discoloration of the molded articles remain a serious problem for the molder. Conventional adjuvants are found to have a markedly deleterious effect on the melt viscosity of these resins, leading to major problems in melt fabrication operations. Moreover, many of the prior art flame retardant formulations recognized for use with polyamides are found to reduce the crystallinity of high temperature partially aromatic copolyphthalamides, particularly when the formulation is subjected to repeated melt processing, and this deficiency may severely limit their acceptability for use in applications where a high degree of dimensional stability at elevated temperatures is necessary.

A method for improving the overall stability of flame retarded polyphthalamide resins under the melt processing conditions required for their fabrication, thereby minimizing discoloration and accomplishing a further reduction in the production of corrosive volatile decomposition products, would clearly represent an advance in the art.

SUMMARY OF THE INVENTION

This invention is directed to fire-retarded, high temperature polyamides comprising conventional fire retardants wherein the thermal stability, particularly during melt processing, is improved by the further addition of calcium oxide, and to a method for improving the thermal stability of flame retarded high temperature polyamides. The invented compositions exhibit good melt viscosity characteristics and a significant reduction in thermal decomposition when subjected to melt processing as shown by a reduced evolution of corrosive volatile byproducts. Molded articles comprising the invented formulations are improved in color.

The invented method may be particularly useful for providing improved heat aging characteristics and molding stability in high temperature polyphthalamides that are flame retarded with conventional bromine-containing flame retardants. The desirable mechanical, chemical and physical properties that are typical of polyphthalamides are maintained for these improved formulations and retained during thermal processing, even after repeated exposure to extreme temperature conditions such as, for example, the conditions encountered during injection molding or other melt processing operations.

DETAILED DESCRIPTION OF PREFERRED EMBODIMENTS

The improved fire retardant polyamide compositions of this invention will comprise a high temperature polyamide, preferably a fiber-filled high temperature polyamide, flame retarded with a conventional flame retardant combination of a halogen-containing organic compound and an antimony-containing compound, together with calcium oxide. More preferably, the improved flame retarded polyamide composition of this invention will be a glass fiber-filled polyphthalamide containing a conventional flame retardant, preferably a combination of a bromine-containing flame retardant and an antimony-containing compound, the thermal stability of the composition being improved according to the teachings of this invention by adding thereto from about 0.2 to about 2 wt % calcium oxide, based on total weight.

Polyphthalamides that are particularly desirable for use as the high temperature polyamide component in the practice of the invention include the various linear, high temperature polyphthalamides that require high processing temperatures and are thus difficult to melt process without deterioration. Particularly preferred are the crystalline or semi-crystalline high temperature partially-aromatic copolyphthalamides comprising terephthalamides of aliphatic diamines as well as further copolymers thereof containing aliphatic diamide moieties. Particularly preferred copolymers include those containing at least 40 mole % of the terephthalamide units, together with at least one aliphatic diamide of an aliphatic diamine.

In greater detail, the polyphthalamide component of the invented compositions may be a crystallizable polyamide comprising at least about 40 mole %, preferably greater than about 50 mole % recurring aliphatic diamine terephthalamide units which may be further described as represented by the following structural formula:

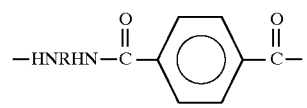

wherein R comprises at least one aliphatic hydrocarbyl radical.

Preferably, aliphatic radicals R in the above formula will comprise at least one straight chain, branched or cyclic, substituted or unsubstituted aliphatic radical having from about 2 to about 14 carbon atoms. These radicals are preferred because polyphthalamides comprising the same exhibit good crystallinity and desirable high temperature properties, together with melting and thermal degradation temperatures making them well suited for melt processing with the modifying components of the invented compositions. Specific examples of suitable aliphatic radicals include tetramethylene, hexamethylene, dodecamethylene and the like, as well as their alkyl-substituted analogs such as 2-methylpentamethylene, 2,4-dimethylhexamethylene and the like, and cyclic analogs such as p-cyclohexyl and the like. Most preferably, R in the formula comprises a hexamethylene radical, either alone or as mixture with additional aliphatic 2 to 14 carbon atom radicals.

The polyphthalamide component will have a melting point of at least about 270° C. as a result of the high content of terephthalamide units. Preferred polyphthalamide components are those melting at about 290° C. to about 330° C. because the same exhibit particularly desirable thermal properties and are more easily processed than even higher melting polyphthalamides.

The polyphthalamide component of the invented compositions also may comprise a portion of recurring units as described above but wherein radicals R are replaced with one or more other types of divalent hydrocarbyl radicals, e.g. substituted or unsubstituted aromatic radicals. Specific examples of such other radicals include m-phenylene, p-phenylene, m-xylylene, p-xylylene, oxybisphenylene and methylene bisphenylene. When such other radicals are present, the proportion thereof should not be so great as to adversely affect desirable properties of the polyphthalamide component, such as strength, thermal properties and melt processability. Preferably, not greater than about 30 mole % of the recurring units of the polyphthalamide comprises such other radicals.

The polyphthalamide may further comprise, in addition to the terephthalamide units represented by the formula above, one or more other recurring carbonamide units including aliphatic diamine aliphatic diamide units such as, for example, hexamethylene adipamide, 2-methylpentamethylene adipamide, hexamethylene sebacamide, hexamethylene azeleamide, hexamethylene dodecamethylamide, hexamethylene cyclohexanedicarboxylamide, dodecamethylene adipamide, and units derived from lactams such as caprolactam; aromatic diamide units such as m-xylylene isophthalamide, p-xylylene isophthalamide, oxybisphenylene isophthalamide or the like; and aliphatic-aromatic diamide units such as, for example, hexamethylene isophthalamide, hexamethylene 2,6-naphthalene dicarboxylamide, m-xylylene adipamide, heptamethylene isophthalamide, dodecamethylene isophthalamide, m-phenylene adipamide or the like. Preferred among such additional carbonamide units are hexamethylene adipamide, hexamethylene isophthalamide and caprolactam units and combinations thereof.

Proportions of such other carbonamide units in the polyphthalamide compositions should not be such as to adversely affect processability or desirable properties of the invented compositions. Generally, at least about 40 mole % of the carbonamide moieties of the polyphthalamide composition is provided by aliphatic diamine terephthalamide units corresponding to the formula above to assure crystallinity and desirable strength and thermal properties. More preferably, greater than about 50 mole %, and still more preferably from about 50 to about 90 mole % of such moieties are provided by such units to achieve good properties and ensure melt processing compatibility of the polyphthalamide component and the modifying component.

A preferred polyphthalamide for use in the flame-retarded component of the invented compositions comprises a semi-crystalline polyphthalamide of fast or intermediate crystallization rate comprising recurring units corresponding to structural formulas A, B and C as shown below in proportions of about 40 to about 95 mole % A, 0 to about 35 mole % B and about 5 to about 60 mole % C.

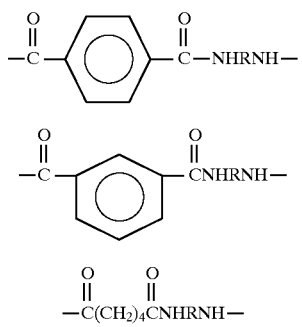

In the above formulas, R comprises at least one aliphatic hydrocarbyl radical as described hereinabove, and may represent a mixture of aliphatic 2 to 14 carbon atom radicals.

Particularly preferred among such polyphthalamides are those wherein the mole ratio of the units A, B and C ranges from about 55–70:25–0:45–5 because such compositions exhibit excellent thermal and mechanical properties. Such polyphthalamides have melting points of about 300° to about 350° C., glass transition temperatures ($T_g$) of about 90° to about 130° C. and inherent viscosities generally ranging from about 0.75 to about 1.4 dl/g with about 0.9 to about 1.25 dl/g being preferred from the standpoint of properties of molded parts and ease of molding.

Especially preferred among such polyphthalamides are those wherein R in the above formulas comprises hexamethylene. Also highly suitable as the polyphthalamide component of the invented compositions are polyphthalamides comprising two of the units A, B and C shown above, such as those with mole ratios of 45:0:55, 60:0:40 and 55:0:45, while terpolymers with minor amounts of the isophthalamide component B, for example in mole ratios such as 50:5:45, 40:5:55 and the like, may be found particularly desirable for use where lower melt temperatures will be encountered.

Although the molecular weight of the polyphthalamide is not particularly important to the practice of the invention, resins having inherent viscosities greater than about 0.7, preferably greater than about 0.8, when measured at 30° C. in a 60/40 phenol/tetrachloroethylene (TCE) mixture at a concentration of 0.4 g/dl will be preferred for most molding applications. Although there is no particular upper limit for molecular weight of the polyphthalamide component, to be suitable for use in these compositions the resin must be melt processable, and very high molecular weight polyphthalamides, those with an inherent viscosity much above about 1.5 to as great as 2.0 or greater, may be extremely difficult to process thermally either by injection molding or by extrusion, hence such resins will not be preferred.

A variety of copolyphthalamides including those described herein as preferred are readily available from commercial sources, and methods for their preparation are also fully described in the art, for example, in U.S. Pat. Nos. 4,603,166 and 4,831,108, 5,112,685 and 4,163,101 and in European Patent Application 309,095; the teachings of these patents and applications are hereby incorporated herein by reference. Polyphthalamides comprising hexamethylene diamine terephthalamide units together with one or more additional units such as hexamethylene adipamide units, hexamethylene isophthalamide units and the like are available from a variety of commercial sources, including Arlen® polyamides from Mitsui Corporation and Amodel® polyphthalamide resins from Amoco Polymers, Inc.

Copolymers and terpolymers comprising terephthalamides of two or more aliphatic diamines or terephthalamides of mixed isomeric aliphatic diamines such as hexamethylene diamine and 2-methylpentamethylene diamine have been described in the art, and copolymers comprising units of caprolactam together with units of hexamethylene diamine terephthalamide are available commercially as Ultramid polyamides from BASF Corporation. However, the addition of calcium oxide according to the teachings of the invention to flame-retarded terephthalamide copolymers that do not contain aliphatic diamide units such as hexamethylene adipamide units will be seen to provide little if any improvement in processing stability or color. Such copolymers are therefore not preferred.

The high temperature polyamides are made flame retardant by further compounding with a conventional flame retardant combination of a organohalogen compound and an antimony compound.

Generally, the organohalogen compounds known in the art and conventionally described as halogen-containing fire-retardant compounds will be suitable for use in the practice of the invention and particularly desirable among them will be those generally characterized as bromine-containing flame retardants. Such compounds are available from commercial sources and include, for example, brominated polystyrene, available as Pyrocheck® from Ferro Corporation, brominated polyphenylene ether, available as PO64P from Great Lakes Corporation and polydibromostyrene, available from Teijin, Ltd. and as PDBS80 from Great Lakes Corporation.

Additional suitable halogenated compounds are also disclosed in the art such as, for example, polytribromostyrene, polypentabromostyrene, polydichlorostyrene, polytrichlorostyrene, polypentachlorostyrene and polytribromo-alpha-methylstyrene, as well as polydibromo-p-phenylene oxide, polytribromo-p-phenylene oxide, polydichloro-p-phenylene oxide, polybromo-p-phenylene oxide, and polybromo-o-phenylene oxide, and a number of such compounds may also be available from commercial sources. Polybrominated biphenyl, brominated phenoxy resins and the like, as well as chlorine-containing flame retardants such as Dechlorane, are also available from a variety of commercial sources for use as flame retardants, and these may also be found useful in the practice of this invention. Bromine-containing flame retardants and particularly brominated polystyrene flame retardants will generally be preferred.

The halogenated flame retardant compounds are generally used in the art in combination with an antimony compound. Among the antimony compounds conventionally used with brominated polystyrenes and with brominated polyphenylene oxides as a fire-retarding aid are antimony trioxide and sodium antimonate. A main component of sodium antimonate sold for use as a fire-retarding aid has the chemical composition $Na_2Sb_2O_6$. Generally, the antimony compound will be used in a finely divided form, having particle diameter of preferably not more than 30 microns, more preferably not more than 10 microns.

Conventionally, flame retardant formulations comprise 100 pbw (parts by weight) of the polyamide, from about 10 to 100 pbw of the bromine-containing organic compound, preferably a bromine-containing styrene polymer such as brominated polystyrene or polydibromostyrene, and from about 0.5 to about 50 pbw, preferably from about 1 to about 15 pbw of the antimony compound, preferably sodium antimonate.

Optionally, the flame retarded polyamide compositions according to this invention may further comprise from about 10 to about 60 wt %, preferably from about 10 to about 45 wt %, of a fibrous reinforcing agent. Fibrous reinforcing agents are commonly added to such formulations in order to impart further improvement in heat resistance and fire-retardant properties, as well as to increase rigidity, tensile strength and flexural strength. Fibrous reinforcing agents suitable for use in the practice of this invention include any of the inorganic fibrous reinforcing agents conventionally employed in the art as reinforcing fillers for polyamides such as glass fibers, potassium titanate fibers, metal-coated glass fibers, ceramic fibers, wollastonite, carbon fibers, metal carbide fibers and metal-hardened fibers. The surfaces of such fibrous reinforcing agents may be treated as necessary with conventional sizing agents, lubricants and the like. Glass fibers are widely known as particularly effective reinforcing agents for polyamide resins and these will be preferred.

Combinations of organohalogen compounds and antimony compounds are well-known and widely used commercially for flame retarding a great many resins, and have generally been found to be highly acceptable for use with aliphatic polyamides such as nylon 6,6 and the like. However, the combination of a halogenated polystyrene or halogenated polyphenylene oxide with sodium antimonate is generally reasonably stable only at processing temperatures of up to about 300° C. Many of the commercially available flame retardants such as polybrominated polystyrene are described by their suppliers as being not recommended for use at temperatures above about 320° C. because of the extensive decomposition that occurs at these high temperatures. Because high temperature polyamides generally are melt fabricated at temperatures well in excess of 300° C., indeed as high as 350° C., particularly when filled, thermal decomposition of the flame retardant frequently occurs, in turn inevitably causing the molded article to be discolored and detrimentally affecting the mechanical properties of the resin composition.

In order to improve the heat stability and thereby eliminate or minimize thermal decomposition during molding, the flame retardant high temperature polyamide formulations of this invention further comprise finely divided calcium oxide. The amount of calcium oxide necessary to effect improvement in the heat stability may depend in part upon the particular polyamide employed, as well as upon the particular combination of antimony oxide and halogen-containing flame retardant selected. Generally, the amount will be from about 0.05 to about 50 pbw, preferably 0.1 to about 10 pbw calcium oxide per 100 pbw of the polyamide component. The amount of calcium oxide may also be characterized as being about 0.2 to about 2 wt %, preferably from about 0.2 to about 1 wt %, based on total weight of the composition, including such fillers, additives and fiber as may also be present. At lower levels of calcium oxide the improvement may be found to be vanishingly small. While at high levels of calcium oxide, levels greater than about 2 wt %, the improvement in thermal stability may also be observed, the presence of unneeded particulate materials can detrimentally affect other properties including mechanical properties and hence these levels are not preferred. The particle size of the heat stabilizer will preferably be small, generally less than about 30 microns, preferably not more than 10 microns. For some uses, the presence of extremely fine particulates, those with a particle size less than about 1 micron, may be found to be ineffective for use with some flame retardant materials, or to have a deleterious effect on properties, hence these very small particulate calcium oxides will preferably be avoided.

The polyamide compositions of this invention may further contain conventional additives widely known and used in the resin arts provided that such additives do not significantly affect the desirable flame retardant character of the formulation. For example, thermal stabilizers, UV stabilizers, plasticizers, nucleating agents, antistatic agents, processing aids including mold release agents, lubricants and the like, as well as pigments, dyes, inorganic or organic fillers such as carbon black, talc, clay, mica and the like may usefully be included. Conventional polymeric impact modifiers may also be desirable for use in these formulations, including polyolefins such as polyethylene, polypropylene and poly(4-methyl-1-pentene), olefin copolymers such as ethylene/propylene copolymer, ethylene/1-butene copolymer, propylene/ethylene copolymer and propylene/1-butene copolymer, polyolefin elastomers, and the like. The great variety of functionally-modified polymers that are well-known and widely used in the art as impact modifiers for polyamides may also be employed in the practice of this invention, including maleated polyolefins, maleated EPR and EPDM olefin rubbers, maleated block copolymers and terpolymers comprising styrene segments and olefinic polymeric segments, acrylic rubbers and similar copolymers containing acrylic or methacrylic units capable of providing reactive functionality, and the like.

Blends of the high temperature polyphthalamide component with other polyamides such as nylon 6 or nylon 6,6 are well-known and widely disclosed in the art, as are blends comprising polyarylates, polycarbonates, polyacetals, polysulfones, polyphenylene oxides, fluorine resins and the like. Such blends may also be found useful in the practice of the invention.

Any of the compounding processes commonly used in the resin compounding arts may be usefully employed for mixing the polyamide, organohalogen flame retardant and the antimony compound components, together with the calcium oxide and, as required, the fibrous reinforcing agent, to provide the flame retarded formulations of this invention. For example, the solid components may be blended in finely divided form using a Henschel mixer, V-blender, ribbon blender or tumbler blender, and then melt processed in an extruder. The formulation may be profile-extruded to form the finished article, or may be provided as a strand or the like and then chopped, granulated or pulverized to provide the flame retarded formulation in a form suited to further melt fabrication, for example by injection molding, sheet extrusion or the like.

The invented formulation has excellent fire retardancy, heat resistance, rigidity and impact strength and a high heat distortion temperature, and can be molded into various articles such as machine parts and electric and electronic component parts by various molding methods such as compression molding, injection molding, extrusion and thermoforming as in the case of molding general-purpose thermoplastic resin. The increased thermal stability of the invented formulations, even at high compounding temperatures, prevent or substantially reduce the incidence of foaming or unacceptable coloration during processing, and may prevent plate out and corrosion of molds and molding equipment. The improved thermal stability of these formulations may also be important in applications where fire-retardant polyamides having excellent heat resistance, particularly soldering resistance, and a high heat distortion temperature are needed.

The invention will be better understood by consideration of the following examples in which the effectiveness of calcium oxide as an additive to flame retarded formulations was evaluated.

EXAMPLES

In these examples, blend formulations containing various polyphthalamide (PPA) copolymers together with the flame retardant combination of bromine-containing organic compound and sodium antimonate and calcium oxide were compared with control examples containing no calcium oxide and with comparison formulations containing prior art additives, particularly magnesium oxide and zinc oxide.

The following analytical methods were employed to obtain the data necessary for making the comparisons.

Differential Scanning Calorimetry (DSC)

The thermal stability of these blends was investigated by exposing the material to three cycles of heating and cooling by heating from 0° C. to 350° C. at 20° C./min and cooling from 350° C. to 50° C. at 10° C./min (entire procedure in nitrogen). By repeating this heating and cooling three times, three different melting temperatures, crystallization temperatures, and heats of fusion and crystallization were obtained.

Kayeness Rheology

The sample was first dried to a moisture content <500 ppm using a vacuum oven at 100° C. The melt viscosity of the dried sample was measured in a Kayeness rheometer fitted with a capillary having a diameter of 0.04 inches, L/D ratio of 15/1 and an entrance angle of 90° C., using test weight of 11.0 grams, a melt time of 188 seconds, a delay time of 87 seconds, and a melt force of 300 lbs; the sample was tested at a shear rate of 400 see$^{-1}$ and 335° C. Melt viscosity was recorded after dwell times of 5 minutes (t5), 10 minutes (t10), and 15 minutes (t15).

Thermogravametric analysis (TGA)

The sample weight was monitored while heating in dry nitrogen at a rate of 10° C./min. The data are presented as the temperature at which a certain percentage of weight is lost (either 1%, 2%, 5% or 10%).

Off-gas analysis

This method provides a measure of the amount of HBr and HCl given off by the formulation when heated at a temperature selected to fall in the normal processing range for these materials. The analysis is carried out by placing a ceramic boat containing approximately 5 g of polymer in a quartz tube and heating the tube in a furnace while collecting the off-gases by means of a helium stream and absorbing the acid components in water. After first thoroughly drying the sample by heating at 250° C. for 30 minutes in a stream of helium, the furnace temperature is increased to 340° C. and held for 30 minutes while the gases exiting the tube are passed through a gas collection tube containing 75 ml of deionized water. The tube contents are then diluted to 100 ml and analyzed for HCl and HBr concentrations by IC methods.

The formulations of the following examples were prepared using the following components:

| Polyamide: | |
| --- | --- |
| PPA-1 | Hexamethylene terephthalamide/hexamethylene adipamide 65/35 copolymer, obtained as Amodel A-4000 PPA polyphthalamide from Amoco Polymers, Inc. |
| PPA-2 | Hexamethylene terephthalamide/Hexamethylene terephthalamide/hexamethylene adipamide 65/25/10 copolymer, obtained as Amodel A-1000 PPA polyphthalamide from Amoco Polymers, Inc. |
| PPA-3 | Hexamethylene terephthalamide/hexamethylene adipamide 55/45 copolymer, obtained as Amodel A-6000 PPA polyphthalamide from Amoco Polymers, Inc. |
| PPA-4 | Polymer of terephthalic acid, adipic acid (75/25)/Hexamethylene diamine 2-methylpentamethylene diamine (77/23). |
| PPA-5 | Hexamethylene terephthalamide/caprolactam (70/30) copolymer. |
| PPA-6 | Hexamethylene terephthalamide/2-methylpentamethylene terephthalamide (50/50) copolymer. |

| Flame Retardant: | |
| --- | --- |
| FR-1 | Brominated polystyrene flame retardant, obtained as Pyrochek 68-PB from Ferro Corporation. |
| FR-2 | Poly(dibromostyrene) flame retardant, obtained as PDBS80 from Great Lakes Chemical Company. |
| Sodium Antimonate | Obtained as Polybloc ® SAP-2 from Anzon Division of Cookson Specialty Additives. |

| Metal Oxide: | |
| --- | --- |
| CaO-1 | Calcium oxide obtained from Aldrich Chemical Company. |
| CaO-2 | Calcium oxide obtained from Chemie Limited. |
| CaO-3 | Calcium oxide having 1–5 micron particle size, obtained as CA602 from Atlantic Equipment Engineers. |
| CaO-4 | Calcium oxide having <1 micron particle size, obtained as CA603 from Atlantic Equipment Engineers. |
| ZnO | Zinc Oxide. |
| MgO | Magnesium oxide, obtained as KM-3-150 from Kyowa. |

| Additives: | |
| --- | --- |
| PTFE | Polytetrafluoroethylene lubricant, obtained as Algoflon DF-11X from Ausimont, U.S.A. |
| Talc | Obtained as Mistron Vapor Talc from Luzenac America, Inc. |
| PEPQ | Phosphite thermal stabilizer obtained as SandoStab PEPQ from Sandoz Chemical Company. |

All formulations contain 33 wt % glass fiber, unless otherwise indicated. All formulations are given in wt % based on total weight of the formulation, including fiber where present.

Examples 1–5

Control Example and Comparative Examples C1–C6

The compositions of the examples set forth below were prepared by mixing the requisite amounts of resin and additives and then melt extruding the blend using methods and processing equipment common to the resin processing art. Generally, the dry blends were extruded using a Berstorff 25 mm twin screw extruder, fitted with a #11 screw and vacuum vented at approximately 25 inches Hg, using barrel temperatures in the range 300°–345° C. (set point), melt temperatures of about 320°–325° C., and nominal screw speeds of about 300 rpm.

TABLE 1

Flame Retardant, 33 wt % Glass Fiber-filled, PPA-1 Polyphthalamide Formulations

| Ex. No. | PPA-1 wt %* | FR-1 wt %* | Sodium Anti-monate wt %* | PTFE wt %* | Talc wt %* | Oxide wt %* |
|---|---|---|---|---|---|---|
| control | 43.43 | 18.68 | 3.61 | 1.0 | 0.28 | none |
| 1 | 43.17 | 18.56 | 3.58 | 1.0 | 0.28 | 0.4% CaO-1 |
| 2 | 43.17 | 18.56 | 3.58 | 1.0 | 0.28 | 0.4% CaO-2 |
| 3 | 42.91 | 18.45 | 3.56 | 1.0 | 0.28 | 0.8% CaO-2 |
| 4 | 42.91 | 18.45 | 3.56 | 1.0 | 0.28 | 0.8% CaO-3 |
| 5 | 42.91 | 18.45 | 3.56 | 1.0 | 0.28 | 0.8% CaO-4 |
| C1 | 43.17 | 18.56 | 3.58 | 1.0 | 0.28 | 0.4% ZnO |
| C2 | 42.91 | 18.45 | 3.56 | 1.0 | 0.28 | 0.8% ZnO |
| C3 | 43.17 | 18.56 | 3.58 | 1.0 | 0.28 | 0.4% MgO |
| C4 | 43.17 | 18.56 | 3.58 | 1.0 | 0.28 | 0.4% $CaCO_3$ |
| C5 | 42.77 | 18.39 | 3.55 | 1.0 | 0.28 | 0.8% CaO-2 0.2% MgO |
| C6 | 42.77 | 18.39 | 3.55 | 1.0 | 0.28 | 0.8% ZnO 0.2% MgO |

Note: *Wt % based on total weight of formulation, including glass fiber (33 wt %). For abbreviations, details of components, see text.

These test formulations were molded as needed to provide appropriate test specimens, and these were analyzed by DSC, TGA and Kayeness rheology methods as outlined above. Injection molding was accomplished using a 30 ton Boy screw injection molding machine at melt temperatures in the range 305°–335° C. and an oil-heated mold at a temperature of about 190° F.

The molded test specimens were also observed for color and appearance, and specimens were subjected to a vertical burning test in accordance with UL-94 Standards and to tensile testing in accordance with ASTM-D638.

TABLE 2

Effect of Various Oxides on the DSC Stability of Blends

| Ex. No. | Additive wt % | Crystallization Temperature (Tc) | | | ΔTc (3rd - 1st) | ΔHc (3rd/1st) |
|---|---|---|---|---|---|---|
| | | 1st Cool °C. | 2nd Cool °C. | 3rd Cool °C. | | |
| control | None | 284.0 | 272.6 | 221.2 | 62.8 | 0.19 |
| 1 | 0.4% CaO-1 | 289.6 | 283.1 | 276.3 | 13.3 | 0.90 |
| 2 | 0.4% CaO-2 | 290.4 | 283.2 | 275.5 | 14.9 | 0.89 |
| 3 | 0.8% CaO-2 | 290.0 | 282.9 | 276.2 | 13.8 | 0.88 |
| 4 | 0.8% CaO-3 | 290.3 | 284.3 | 278.0 | 12.2 | 0.81 |
| 5 | 0.8% CaO-4 | 282.3 | 265.1 | 241.0 | 41.3 | 0.26 |
| C1 | 0.4% ZnO | 286.5 | 274.5 | 258.4 | 28.1 | 0.83 |
| C2 | 0.8% ZnO | 285.7 | 272.9 | 255.1 | 30.7 | 0.74 |
| C3 | 0.4% MgO | 289.9 | 269.8 | 242.2 | 47.7 | 0.59 |
| C4 | 0.4% $CaCO_3$ | 257.1 | — | — | — | — |
| C5 | 0.8% CaO-2 0.2% MgO | 289.2 | 273.6 | 254.5 | 34.7 | 0.74 |
| C6 | 0.8% ZnO 0.2% MgO | 288.4 | 277.0 | 262.2 | 26.3 | 0.76 |

DSC data for the blends of Table 1 are summarized in Table 2. It will be apparent that all of the oxides improved the retention of crystallinity, as measured by a lessened shift of the third temperature of crystallization compared with the first cycle, ΔTc (3rd −1st). There also is seen an improvement in the retention in crystallinity, as shown by ratio of the heat of crystallization for third and first heat, ΔHc(3rd/1st). Calcium oxide is seen to be much more effective at maintaining the position of the third crystallization peak and retaining the heat of crystallization in the third cooling than either of the prior art additives zinc oxide and magnesium oxide. Moreover, a high loading of ZnO (0.8% instead of 0.4%) produced a blend with even lower retention of crystallinity. $CaCO_3$ caused a substantial reduction in stability; the run was stopped after the first cycle, and no further DSC data were obtained.

While calcium oxide appears to be an effective additive for this purpose, for extremely low particle size calcium oxide, less than 1 micron, the effectiveness in retention of crystallinity was substantially reduced.

TABLE 3

Effect of Various Oxides on the Kayeness Stability of Blends

| Ex. No. | Additive wt % | Viscosity (poise) After | | | t10/t5 % | t15/t5 % |
|---|---|---|---|---|---|---|
| | | 5 min. | 10 min. | 15 min. | | |
| control | None | 2799 | 1797 | 1349 | 64 | 48 |
| 1 | 0.4% CaO-1 | 2382 | 1793 | 1350 | 75 | 57 |
| 2 | 0.4% CaO-2 | 2089 | 1629 | 1271 | 78 | 61 |
| 3 | 0.8% CaO-2 | 2174 | 1653 | 1257 | 76 | 58 |
| 4 | 0.8% CaO-3 | 1849 | 1369 | 1013 | 74 | 55 |
| 5 | 0.8% CaO-4 | 2025 | 1414 | 1003 | 70 | 50 |
| C1 | 0.4% ZnO | 1446 | 507 | 1092 | 35 | 76 |
| C2 | 0.8% ZnO | 1190 | 109 | 88 | 9 | 7 |
| C3 | 0.4% MgO | 1131 | 354 | 1087 | 31 | 96 |
| C4 | 0.4% $CaCO_3$ | 2580 | 1213 | — | 47 | — |
| C5 | 0.8% CaO-2 0.2% MgO | 1558 | 303 | 1069 | 19 | 69 |
| C6 | 0.8% ZnO 0.2% MgO | 1449 | 184 | 844 | 13 | 58 |

The Kayeness viscosity data presented in Table 3 demonstrates that addition of calcium oxide improved the viscosity profile of this blend. Addition of either ZnO or MgO had a dramatically negative effect on the viscosity stability of the blend, as did the formulation containing $CaCO_3$. These in turn have an unfavorable affect on processability, causing die drool and melt stability problems. The presence of even a small amount of magnesium oxide, as in Comparison, Example C5, negatively affects the viscosity of the blend. While not wishing to be found by a particular theory, loss in melt viscosity over time is generally thought to be associated with a reduction in polymer molecular weight resulting from shear degradation or thermal decomposition during processing. For some polymer formulations a loss in melt viscosity may occur during thermal or shear processing, followed by an increase in melt viscosity over time, which is believed to be an indication that cross-linking in the melt has occured.

TABLE 4

Effect of Various Oxides on the Thermogravametric Analysis of Blends

| Ex. No. | Additive wt % | Temperature (°C.) at: | | | |
|---|---|---|---|---|---|
| | | 1% Wt. Loss | 2% Wt. Loss | 5% Wt. Loss | 10% Wt. loss |
| control | None | 353.46 | 368.63 | 375.55 | 381.11 |
| 1 | 0.4% CaO-1 | 353.03 | 377.29 | 388.29 | 393.46 |
| 2 | 0.4% CaO-2 | 369.85 | 380.48 | 387.45 | 392.58 |
| 3 | 0.8% CaO-2 | 368.10 | 383.72 | 393.16 | 398.76 |
| 4 | 0.8% CaO-3 | 369.41 | 384.98 | 395.76 | 401.54 |
| 5 | 0.8% CaO-4 | 356.20 | 363.36 | 371.20 | 378.65 |
| C1 | 0.4% ZnO | 360.06 | 374.56 | 384.81 | 390.95 |
| C2 | 0.8% ZnO | 356.83 | 372.62 | 387.69 | 393.35 |
| C3 | 0.4% MgO | 334.71 | 361.04 | 381.23 | 387.52 |
| C5 | 0.8% CaO-2 0.2% MgO | 355.75 | 373.92 | 391.17 | 397.73 |
| C6 | 0.8% ZnO 0.2% MgO | 361.70 | 378.00 | 395.18 | 403.84 |

The Thermogravametric data are summarized in Table 4. It will be seen that adding calcium oxide decreased the rate of volatiles. The source of calcium oxide may affect weight loss; at 8% CaO, the smallest particle size CaO gave the poorest performance with respect to volatiles. Both ZnO decrease the temperature for 1% weight loss, with magnesium oxide given the poorest result. This is a significant negative, and may be the reason that blends with MgO give more plate-out than those without MgO.

TABLE 5

Effect of Various Oxides on the Tensile Data and Flame Rating of Blends

| Ex. No. | Additives wt % | Tensile Strength (psi) | E (%) | Burn Rating | Burn Time (sec) | Mold Sprue Color |
|---|---|---|---|---|---|---|
| control | None | 26,220 | 1.80 | V0 No Drip | 16 | Gray w/ dark sections |
| 1 | 0.4% CaO-1 | 26,180 | 1.73 | V0 No Drip | 24 | Tan with medium gray region |
| 2 | 0.4% CaO-2 | 26,650 | 1.74 | V0 No Drips | 25 | Tan |
| 3 | 0.8% CaO-2 | 25,320 | 1.67 | V1 No Drips | 31 | Tan |
| 4 | 0.8% CaO-3 | 24,390 | 1.54 | V0 No Drips | 13 | Dark Tan |
| 5 | 0.8% CaO-4 | 25,290 | 1.61 | V0 2/5 Drips | 26 | Dark Tan |
| C1 | 0.4% ZnO | 25,680 | 1.66 | V0 No Drips | 21 | Light Gray |
| C2 | 0.8% ZnO | 24,590 | 1.59 | V0 No Drips | 27 | Gray |
| C3 | 0.4% MgO | 23,100 | 1.45 | V0 No Drip | 12 | Tan with medium gray region |
| C4 | 0.4% CaCO$_3$ | 28,250 | | V2 Fl Drip | 7 | Dark Gray with black regions |
| C5 | 0.8% CaO-2 | 23,870 | 1.55 | V1 | 55 | Tan |
| C6 | 0.2% MgO 0.8% ZnO 0.2% MgO | 24,070 | 1.51 | 1/5 Drip V0 No Drips | 26 | Gray |

Table 5 summarizes the tensile and flame data for these blends. With respect to color, both calcium oxide and magnesium oxide gave moldings with improved color, tan for these formulations, compared with gray for the control; zinc oxide also gave an undesirable gray color. Magnesium oxide reduced tensile strength markedly, by 2,000–3,000 psi at only 0.4%, loading of 0.8%, calcium oxide and zinc oxide effected smaller decreases in about 1,000–2,000 psi. It was also observed for molded specimens of these resins that compositions containing MgO (C3) exhibited considerable splay marking on the surfaces, while those with CaO had no such splay markings.

TABLE 6

Effect of Various Oxides on HBr and HCl Evolution

| Ex. No. | Additive wt % | HBr (ppm) | HCl (ppm) |
|---|---|---|---|
| control | No Additives | 391 | 74 |
| C3 | 0.4% MgO | 221–457 | 13–14 |
| 1 | 0.4% CaO | 255–303 | 35–42 |
| C6 | 0.4% CaO + 0.4% PEPQ | 156 | 38 |
| 2 | 0.4% CaO-2 | 129 | 28 |
| 3 | 0.8% Chemie Ltd CaO-2 | 9 | 8 |
| 4 | 0.8% CaO-3 | 3 | 4 |
| 5 | 0.8% CaO-4 | 321 | 68 |
| C1 | 0.4% ZnO | 61 | 6 |
| C2 | 0.8% ZnO | 2 | 3 |

The off-gases produced in decomposition for several blends were also analyzed. The results are summarized in Table 6. Without any oxide, the Control example produced a high concentration of both HBr and HCl. Addition of 0.4% magnesium oxide, calcium oxide, or zinc oxide does reduce both HCl and HBr; however higher levels of CaO may be required for effective acid scavenging.

Thus, it will be seen from the data and comparisons set forth in Tables 2–5 that adding calcium oxide to the flame retarded polyphthalamide leads to a product with an optimum property profile. The addition of calcium oxide with particle size of 1–5 micron, preferably at an 0.8% weight loading, provided a flame retarded polyphthalamide blend improved in viscosity. In contrast, zinc oxide and magnesium oxide, the additives taught by the prior art to be useful in combination with brominated flame retardants, are seen to cause catastrophic loss of viscosity as measured by the Kayeness rheometry when used with high temperature polyamides (see Table 3). The prior art additives are also less effective than calcium oxide at stabilizing crystallinity, as determined by DSC measurement, (see Table 2). Magnesium oxide is seen to increase the rate of volatilization, as measured using TGA, and to cause serious splaying in the molded articles, while zinc oxide caused discoloration (see Tables 4 and 5).

The use of calcium oxide according to the invention in combination with other flame retardants and in other polyphthalamides is shown in the following examples.

Example 6

Control Example and Comparative Examples C7 and C8

In the following examples, polyphthalamide formulations were prepared and tested substantially as in Examples 1–5, but using FR-2 poly(dibromostyrene) as the flame retardant component. The formulations of Example 6, C7 and C8 contained 43.17 wt % PPA-1, 18.56 wt % FR-2 polydibromostyrene, 3.58 wt % Sodium Antimonate, 1.0 wt % PTFE, 0.28 wt % talc and 0.4 wt % of the metal oxide additive, together with 33 wt % glass fiber. A control example without metal oxide was similarly prepared having 43.43 wt % PPA-1, 18.68 wt % FR-2 polydibromostyrene, 3.61 wt % Sodium Antimonate, 1.0 wt % PTFE, and 0.27 wt % talc, together with 33 wt % glass fiber. The results of testing for these formulations are summarized in Table 7.

TABLE 7

Effect of Various Oxides on Glass-filled Polyphthalamides with FR-2 Flame Retardant

| Ex. No. | Additive wt % | Kayeness t10/t5 % | Color | T (°C.) 1% Wt. Loss | ΔTc 3rd - 1st °C. | ΔHc 3rd/1st | Tensile Strength Kpsi | Burn Rating |
|---|---|---|---|---|---|---|---|---|
| contr. 6 | None | 76 | white | 347.8 | 15.2 | 0.83 | n.d. | n.d. |
| 6 | 0.4% CaO-3 | 58 | white | 402.0 | 12.6 | 0.93 | 26.8 | V0 no drip |
| C7 | 0.4% ZnO | 32 | white | 389.9 | 25.9 | 0.88 | 25.4 | V0 no drip |
| C8 | 0.4% Mgo | 26 | white | 372.3 | 32.1 | 0.90 | 26.4 | V2 1/5 drip |

Notes: n.d. = not determined; for tests, see text and Tables 2–5.

The alternative bromine source, poly(dibromostyrene), improves the color stability of the formulation, and the viscosity stability of the control formulation with FR-2 is also improved over that of the formulation containing FR-1 (see Table 3). However, the further addition of calcium oxide to the flame retardant polyphthalamide formulation is again seen to be more effective in improving TGA stability and DSC stability than adding either zinc oxide or magnesium oxide.

Examples 7–9

In the following examples, the effectiveness of calcium oxide at higher levels, greater than 0.8 wt %, was evaluated.

Polyphthalamide formulations with higher levels of calcium oxide were prepared and tested substantially as in Examples 1–5, but with the talc component omitted. The formulations contained a minor amount of potassium acid phosphate, $K_2HPO_4$, as an aid in preventing or reducing drip during flame testing. The formulations are summarized in Table 8, the test data in Table 9.

TABLE 8

FR-1 Flame Retardant, 33 wt % Glass Fiber-filled, PPA-1 Polyphthalamide Formulations

| Ex. No. | PPA-1 wt %* | FR-1 wt %* | Sodium Anti-monate wt %* | PTFE wt %* | $K_2HPO_4$ wt %* | Oxide wt %* |
|---|---|---|---|---|---|---|
| 7 | 42.82 | 18.42 | 3.56 | 1.0 | 0.40 | 0.8% CaO-3 |
| 8 | 42.29 | 18.19 | 3.52 | 1.0 | 0.40 | 1.6% CaO-3 |
| 9 | 41.23 | 17.74 | 3.43 | 1.0 | 0.40 | 3.2% CaO-3 |

Note: *Wt % based on total weight of formulation, including glass fiber (33 wt %). For abbreviations, details of components, see text.

TABLE 9

Effect of Calcium Oxide Level on Glass-filled PPA-1 Polyphthalamides with FR-1 Flame Retardant

| Ex. No. | Additive wt % | Kayeness t10/t5 % | Color | T (°C.) 1% Wt. Loss | ΔTc 3rd - 1st °C. | ΔHc 3rd/1st | Tensile Strength Kpsi | Burn Rating |
|---|---|---|---|---|---|---|---|---|
| 7 | 0.8% CaO-3 | 65 | Dark Tan | 379.3 | 15.3 | 0.94 | 29.5 | V0 no drip |
| 8 | 1.6% CaO-3 | 75 | Dark Tan | 362.9 | 16.1 | 0.63 | 24.5 | V0 no drip |

TABLE 9-continued

Effect of Calcium Oxide Level on Glass-filled PPA-1 Polyphthalamides with FR-1 Flame Retardant

| Ex. No. | Additive wt % | Kayeness t10/t5 % | Color | T (°C.) 1% Wt. Loss | ΔTc 3rd - 1st °C. | ΔHc 3rd/1st | Tensile Strength Kpsi | Burn Rating |
| --- | --- | --- | --- | --- | --- | --- | --- | --- |
| 9 | 3.2% CaO-3 | 25 | Dark Tan | 364.5 | 14.3 | 0.0 | 18.1 | V2 1/5 drip |

High levels of calcium oxide, levels above about 1%, have a detrimental affect on the properties of the polyphthalamide formulation. Retention of crystallinity (ΔHc) is negatively affected even at the 1.6% level (Example 8), and the effect on tensile strength as well as viscosity stability (Kayeness t10/t5) is seen to be quite severe at the 3.2% level, and Burn Rating is also lower (Example 9).

The effectiveness of calcium oxide in improving stability of flame retardant polyphthalamides according to the invention will be seen to extend to impact-modified formulations, as shown by the following example.

Example 10 and Comparative Examples C9 and C10

Impact-modified, glass-filled polyphthalamide formulations were prepared and tested substantially as in Examples 1–5, but with FR-2 as the flame retardant, and with the further addition of an impact modifier, a styrenic block copolymer rubber modifier obtained as Kraton FG1901X modifier from Shell Chemical Company. Again, talc was omitted. The formulations contained 32.59 wt % PPA-1, 10.86 wt % Kraton FG1900X modifier, 19.11 wt % FR-2 polydibromostyrene, 3.04 wt % Sodium Antimonate, 1.0 wt % PTFE and 0.4 wt % of the metal oxide additive, together with 33 wt % glass fiber. The test results are summarized in Table 10.

TABLE 10

Effect of Various Oxides on Impact-Modified 33 wt % Glass-filled PPA-1 Polyphthalamides with FR-2 Flame Retardant

| Ex. No. | Additive wt* % | Kayeness t10/t5 % | Δ Tc 3rd–1st °C. | Δ Hc 3rd/1st |
| --- | --- | --- | --- | --- |
| 10 | 0.4 CaO-3 | 72 | 17.9 | 1.08 |
| C9 | 0.4 ZnO | 58 | 31.7 | 0.30 |
| C10 | 0.4 MgO | 61 | 50.9 | 0.36 |

Note:
*Wt % based on total weight of filled; for abbreviations, details of components, see text.

Calcium oxide will be seen to again be more effective in stabilizing the viscosity and in maintaining the crystallinity of the impact-modified polyphthalamide than either zinc oxide or magnesium oxide.

Example 11 and Comparative Examples C11 and C12: PPA-2 Polyphthalamide Formulations In the following examples, polyphthalamide formulations were prepared and tested substantially as in Examples 1–5, but using PPA-2 hexamethylene terephthalamide/hexamethylene isophthalamide/hexamethylene adipamide (65/25/10) copolymer as the polyphthalamide component. Again, talc was omitted and potassium acid phosphate was included as an aid in reducing drip. The formulations contained 42.82 wt % PPA-2, 18.42 wt % FR-1 brominated polystyrene, 3.56 wt % Sodium Antimonate, 1.0 wt % PTFE, 0.40 wt % $K_2HPO_4$ and 0.8 wt % metal oxide additive, together with 33 wt % glass fiber.

As will be readily understood, the mold temperatures and molding conditions were adjusted as required to accommodate the higher melt temperature of the terpolymer.

The test results for the flame retardant terpolymer formulations are summarized in Table 11.

TABLE 11

Effect of Various Oxides on Glass-filled PPA-2 Polyphthalamides with FR-1 Flame Retardant

| Ex. No. | Additive wt % | Kayeness t10/t5 % | Color | T (°C.) 1% Wt. Loss | ΔTc 3rd - 1st °C. | ΔHc 3rd/1st | Tensile Strength Kpsi | Burn Rating |
| --- | --- | --- | --- | --- | --- | --- | --- | --- |
| 11 | 0.8 CaO-3 | 59 | Dark Tan | 389.6 | 5.1 | 0.96 | 29.0 | V0 No drip |
| C11 | 0.8 ZnO | 19 | Gray | 294.3 | 20.8 | 0.79 | 26.3 | V2 4/5 drips |
| C12 | 0.8 MgO | 32 | Tan | 334.3 | 35.2 | 0.86 | 26.4 | V2 |

TABLE 11-continued

Effect of Various Oxides on Glass-filled PPA-2
Polyphthalamides with FR-1 Flame Retardant

| Ex. No. | Additive wt % | Kayeness t10/t5 % | Color | T (°C.) 1% Wt. Loss | ΔTc 3rd - 1st °C. | ΔHc 3rd/1st | Tensile Strength Kpsi | Burn Rating |
|---|---|---|---|---|---|---|---|---|
| | | | w/ gray area | | | | | 4/5 drip |

Note: *Wt % based on total weight of filled; for abbreviations, details of components, see text.

It will be seen from the data in Table 11 that adding calcium oxide to these filled flame-retardant terephthalamide-isophthalamide-adipamide terpolymer formulations provides improvement in color and in viscosity stability, crystallinity, and strength similar to the improvement seen for the filled PPA-1 terephthalamide-adipamide copolymer formulations of Examples 1–5.

Example 12 and Comparative Examples C13 and C14: PPA-3 Polyphthalamide Formulations In the following examples, polyphthalamide formulations were prepared and tested substantially as in Examples 1–5, but using PPA-3 hexamethylene terephthalamide/ hexamethylene adipamide (55/45) copolymer as the polyphthalamide component. Again, talc was omitted and potassium acid phosphate was included as an aid in reducing drip.

The formulations contained 41.41 wt % PPA-3, 19.60 wt % FR-1 brominated polystyrene, 3.79 wt % Sodium Antimonate, 1.0 wt % PTFE, 0.28 wt % K2HPO4 and 0.8 wt % metal oxide additive, together with 33 wt % glass fiber. The results of the testing are summarized in Table 12.

Example 13 and Comparative Examples C15 and C16: PPA-4 Polyphthalamide Formulations In the following examples, polyphthalamide formulations were prepared and tested substantially as in Examples 1–5, but using PPA-4, a polymer of terephthalic acid, adipic acid (75/25 mole ratio), hexamethylene diamine and 2-methylpentamethylene diamine (77/23 mole ratio) as the polyphthalamide component. Again, talc was omitted and potassium acid phosphate was included as an aid in reducing drip. The formulations of Example 13, C15 and C16 contained 41.42 wt % PPA-4, 19.6 wt % FR-1 brominated polystyrene, 3.79 wt % Sodium Antimonate, 1.0 wt % PTFE, 0.4 wt % $K_2HPO_4$ and 0.8 wt % of the metal oxide additive, together with 33 wt % glass fiber. A control example without metal oxide was similarly prepared having 41.93 wt % PPA-4, 19.84 wt % FR-1 brominated polystyrene, 3.83 wt % Sodium Antimonate, 1.0 wt % PTFE, and 0.4 wt % $K_2HPO_4$, together with 33 wt % glass fiber.

The results of the testing for these formulations are summarized in Table 13.

TABLE 12

Effect of Various Oxides on Glass-filled PPA-3
Polyphthalamides with FR-1 Flame Retardant

| Ex. No. | Additive wt % | Kayeness t10/t5 % | Color | T (°C.) 1% Wt. Loss | ΔTc 3rd - 1st °C. | ΔHc 3rd/1st | Tensile Strength Kpsi | Burn Rating |
|---|---|---|---|---|---|---|---|---|
| contr. | None | | | | | | | |
| 12 | 0.8 CaO-3 | 70 | Dark Tan | 395.4 | 14.7 | 0.90 | 28.0 | V0 No drip |
| C13 | 0.8 ZnO | 27 | Gray | 361.0 | 40.4 | 0.76 | 25.6 | V2 4/5 drips |
| C14 | 0.8 MgO | 29 | Tan w/ gray area | 353.1 | 75.1 | 0.46 | 21.8 | V0 no drip |

TABLE 13

Effect of Various Oxides on Glass-filled PPA-4
Polyphthalamides with FR-1 Flame Retardant

| Ex. No. | Additive wt % | Kayeness t10/t5 % | Color | T (°C.) 1% Wt. Loss | ΔTc 3rd - 1st °C. | ΔHc 3rd/1st | Tensile Strength Kpsi | Burn Rating |
|---|---|---|---|---|---|---|---|---|
| contr. | None | 76 | gray, dark | 372.2 | NA | 0.0 | 29.8 | V0 3/5 drip |
| 13 | 0.8 CaO-3 | 65 | dark tan | 382.9 | 45.6 | 0.53 | 28.5 | V0 4/5 drip |
| C15 | 0.8 ZnO | 26 | gray | 372.9 | 68.9 | 0.31 | 27.1 | V0 no drip |
| C16 | 0.8 MgO | 22 | tan w/ gray | 368.8 | NA | 0.0 | 26.3 | V0 no drip |

Example 14 and Comparative Examples C17 and C18: PPA-5 Polyphthalamide Formulations In the following examples, polyphthalamide formulations were prepared and tested substantially as in Examples 1–5, but using PPA-5 hexamethylene terephthalamide/caprolactam (70/30) copolymer as the polyphthalamide component. Again, talc was omitted and potassium acid phosphate was included as an aid in reducing drip. The formulations of Example 14, C17 and C18 contained 41.42 wt % PPA-5, 19.6 wt % FR-1 brominated polystyrene, 3.79 wt % Sodium Antimonate, 1.0 wt % PTFE, 0.4 wt % $K_2HPO_4$ and 0.8 wt % of the metal oxide additive, together with 33 wt % glass fiber. A control example without metal oxide was similarly prepared having 41.93 wt % PPA-5, 19.84 wt % FR-1 brominated polystyrene, 3.83 wt % Sodium Antimonate, 1.0 wt % PTFE, and 0.4 wt % $K_2HPO_4$, together with 33 wt % glass fiber.

The results of the testing for these formulations are summarized in Table 14.

Example 15 and Comparative Examples C19 and C20: PPA-6 Polyphthalamide Formulations In the following examples, polyphthalamide formulations were prepared and tested substantially as in Examples 1–5, but using PPA-6 hexamethylene terephthalamide/2-methyl pentamethylene terephthalamide (50/50) copolymer as the polyphthalamide component. Again, talc was omitted and potassium acid phosphate was included as an aid in reducing drip. The formulations of Example 15, C19 and C20 contained 41.42 wt % PPA-6, 19.6 wt % FR-1 brominated polystyrene, 3.79 wt % Sodium Antimonate, 1.0 wt % PTFE, 0.4 wt % $K_2HPO_4$ and 0.8 wt % of the metal oxide additive, together with 33 wt % glass fiber. A control example without metal oxide was similarly prepared having 41.93 wt % PPA-4, 19.84 wt % FR-1 brominated polystyrene, 3.83 wt % Sodium Antimonate, 1.0 wt % PTFE, and 0.4 w5% $K_2HPO_4$, together with 33 wt % glass fiber.

The results of the testing for these formulations are summarized in Table 15.

TABLE 14

Effect of Various Oxides on Glass-filled PPA-5
Polyphthalamides with FR-1 Flame Retardant

| Ex. No. | Additive wt % | Kayeness t10/t5 % | Color | T (°C.) 1% Wt. Loss | ΔTc 3rd - 1st °C. | ΔHc 3rd/1st | Tensile Strength Kpsi | Burn Rating |
|---|---|---|---|---|---|---|---|---|
| contr. | None | 87 | Tan w/ gray | 379.6 | NA | 0.0 | 29.7 | V0 no drip |
| 14 | 0.8 CaO-3 | 76 | Tan w/ gray | 379.0 | 18.8 | 0.94 | 27.5 | V0 no drip |
| C17 | 0.8 ZnO | 59 | Tan w/ gray | 363.6 | 12.6 | 0.76 | 29.4 | V0 no drip |
| C18 | 0.8 MgO | 75 | Dark Tan | 372.3 | 14.9 | 0.90 | 26.9 | V0 no drip |

TABLE 15

Effect of Various Oxides on Glass-filled PPA-6 Polyphthalamides with FR-1 Flame Retardant

| Ex. No. | Additive wt % | Kayeness t10/t5 % | Color | T (°C.) 1% Wt. Loss | ΔTc 3rd - 1st °C. | ΔHc 3rd/1st | Tensile Strength Kpsi | Burn Rating |
|---|---|---|---|---|---|---|---|---|
| contr. | None | 63 | Gray w/ dark | 377.8 | NA | NA | 30.2 | V0 5/5 drip |
| 15 | 0.8 CaO-3 | 82 | Gray w/ dark | 383.4 | NA | 0.0 | 29.6 | V0 3/5 drip |
| C19 | 0.8 ZnO | 72 | Tan w/ gray area | 377.1 | 58.1 | 0.50 | 28.7 | V2 1/5 drip |
| C20 | 0.8 MgO | 87 | Dark Tan | 380.7 | 6.5 | 0.90 | 28.7 | V0 no drip |

Example 16 and Comparative Examples C21 and C22: Unfilled PPA-1 Polyphthalamide Formulations In the following examples, neat resin polyphthalamide formulations were prepared and tested substantially following the procedures set forth in Examples 1–5, but omitting the glass fiber and the talc; potassium acid phosphate was included as an aid in reducing drip. The formulations of Example 16, C21 and C22 contained 64.63 wt % PPA-1, 27.8 wt % FR-1 brominated polystyrene, 5.37 wt % Sodium Antimonate, 1.0 wt % PTFE, 0.4 wt % $K_2HPO_4$ and 0.8 wt % of the metal oxide additive.

The results of the testing for these formulations are summarized in Table 16.

TABLE 16

Effect of Various Oxides on Unfilled PPA-1 Polyphthalamide with FR-1 Flame Retardant

| Ex. No. | Additive wt % | Kayeness t10/t5 % | Δ Tc 3rd–1st °C. | Δ Hc 3rd/1st |
|---|---|---|---|---|
| 16 | 0.8 CaO-3 | 67 | 20.4 | 0.84 |
| C21 | 0.8 ZnO | 17 | 67.4 | 0.26 |
| C22 | 0.8 MgO | 23 | N.D.* | 0.00 |

Note:
*N.D. not determined-no third peak developed.

The addition of calcium oxide to the neat polyphthalamide resin formulation will be seen to be substantially more effective than either zinc oxide or calcium oxide in improving melt stability. Indeed, catastrophic loss in viscosity (Kayeness t10/t5) occured for formulations containing zinc oxide or magnesium oxide. The calcium oxide formulations also were better able to develop and retain crystallinity during fabrication, as shown by the DSC data.

The invention set forth herein will thus be seen to be an improved flame-retardant polyamide formulation containing a polyphthalamide and a flame-retardant combination of a bromine-containing organic compound such as brominated polystyrene, polydibromostyrene or the like and an antimony-containing compound, preferably sodium antimonate, the improvement being adding calcium oxide in an amount effective to improve the thermal stability of the flame retardant polyamide formulation. The compositions according to the invention may be further characterized as containing, per 100 parts by weight of polyamide, from about 10 to 100 pbw of the bromine-containing organic compound, preferably a bromine-containing styrene polymer such as brominated polystyrene or polydibromostyrene, and from about 0.5 to about 50 pbw, preferably from about 1 to about 15 pbw of the antimony compound, preferably sodium antimonate, and from about 0.05 to about 50 pbw, preferably from about 0.1 to about 10 pbw calcium oxide. The compositions of this invention may further contain from about 10 to about 60 wt % glass fiber, together with such other additives as are commonly employed in the art for compounding flame retardant polyamides. The polyphthalamide component of the composition may be further characterized as a copolyphthalamide comprising aliphatic diamine terephthalamide units and one or more additional carbonamide units, and preferably will be a copolyphthalamide containing aliphatic diamine terephthalamide units and aliphatic diamide units such as hexamethylene adipamide or the like. Particularly preferred are crystallizable copolyamides comprising at least 40 mole % terephthalamide units, still more preferably from about 50 to about 95 wt % terephthalamide units, together with one or more additional carbonamide units, preferably including units of at least one aliphatic diamide. As is well known, blends of aliphatic polyamides such as nylon 6,6 and polyphthalamides, including polyterephthalamides having no aliphatic diamide component, may also be crystalline, and such blends may also be found useful as the polyamide component for use in providing the improved flame-retardant formulations according to the invention.

The invention may also be described as a method for improving the thermal stability of conventionally flame-retarded polyphthalamides comprising a polyphthalamide, a bromine-containing organic compound and a sodium antimonate whereby the flame retardant polyphthalamide is compounded with from about 0.2 to about 2 wt % calcium oxide.

Inasmuch as the method of this invention is also directed to eliminating corrosive by-products created by the thermal decomposition of the flame retardant component of these formulations during processing at elevated temperatures, the method may be adapted for use with a variety of other high temperature resins. For example, a great many other high temperature polyamides are known in the art and commercially available including polytetramethylene adipamide which is available commercially under the trade designation Stanyl polyamide from the DSM Company, and the process of this invention may also be useful in providing improved fire-retarded resin formulations comprising such resins. The method of this invention may also be found useful for improving the stability of flame retardant formulations comprising other well-known high temperature polymers and copolymers such as polyphenylene oxide or the like.

Although the invention has been set forth herein and illustrated by particular embodiments and examples, those skilled in the flame retardant arts will readily understand that further modifications may be made without departing from the scope and spirit of the invention, which is solely defined by the appended claims.

I claim:

1. A composition comprising (a) 100 pbw polyphthalamide; (b) from about 10 to about 100 pbw of a bromine-containing organic compound selected from the group consisting of brominated polystyrene and polydibromostyrene; (c) from about 0.5 to about 50 pbw sodium antimonate; and (d) from about 0.1 to about 10 pbw calcium oxide.

2. The composition of claim 1 further comprising from about 10 to about 60 wt %, based on total composition, glass fiber.

3. The composition of claim 1 wherein said polyphthalamide is a copolymer containing at least about 40 mole % recurring aliphatic diamine terephthalamide units.

4. The composition of claim 1 wherein said polyphthalamide is a copolymer containing recurring aliphatic diamine terephthalamide units and recurring aliphatic diamine aliphatic diamide units.

5. The composition of claim 4 wherein said copolymer contains from about 50 to about 95 mole % said recurring aliphatic diamine terephthalamide units.

6. The composition of claim 1 wherein said polyphthalamide is a copolymer containing recurring aliphatic diamine terephthalamide units having the structure

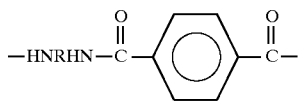

wherein R comprises at least one aliphatic hydrocarbyl radical selected from the group consisting of substituted and unsubstituted aliphatic radical having from about 2 to about 14 carbon atoms.

7. The composition of claim 1 wherein said polyphthalamide is a copolymer containing at least about 40 mole % recurring aliphatic diamine terephthalamide units having the structure

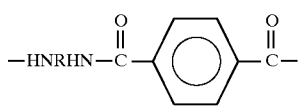

wherein R comprises at least one aliphatic hydrocarbyl radical selected from the group consisting of substituted and unsubstituted aliphatic radicals having from about 2 to about 14 carbon atoms; and recurring aliphatic diamine aliphatic diamide units selected from the group consisting of hexamethylene adipamide, 2-methylpentamethylene adipamide, hexamethylene sebacamide, hexamethylene azeleamide, hexamethylene dodecamethylamide, hexamethylene cyclohexanedicarboxylamide and dodecamethylene adipamide.

8. The composition of claim 1 wherein said polyphthalamide is a copolymer containing recurring units selected from units having the structure:

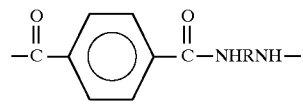

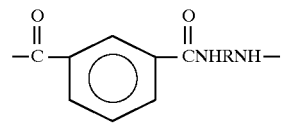

wherein R comprises at least one aliphatic hydrocarbyl radical selected from the group consisting of substituted and unsubstituted aliphatic radicals having from about 2 to about 14 carbon atoms and wherein said recurring units A, B and C are present in the molar ratio A:B:C of 40–95:0–35:5–60.

9. The composition of claim 8 wherein said polyphthalamide comprises recurring units A and C in a ratio A:C of from about 50–95:50–5.

10. The composition of claim 8 wherein said polyphthalamide comprises recurring units A, B and C in a ratio A:B:C of from about 50–70:25–0:45–5.

11. In a composition comprising polyphthalamide and a flame-retarding amount of a bromine-containing organic compound selected from the group consisting of brominated polystyrene and polydibromostyrene and sodium antimonate, the improvement wherein the composition contains an amount of calcium oxide effective to improve the thermal stability of the composition.

12. The composition of claim 11 wherein the ratio of melt viscosities of said composition at 10 minutes and 5 minutes (t10/t5) as measured in a Kayeness rheometer at 335° C. and using a shear rate of 400 sec$^{-1}$ is greater than 0.5.

13. A method for improving the melt stability of a flame retardant polyphthalamide formulation containing (a) 100 pbw polyphthalamide; (b) from about 10 to about 100 pbw of a bromine-containing organic compound selected from the group consisting of brominated polystyrene and polydibromostyrene; (c) from about 0.5 to about 50 pbw sodium antimonate; said method comprising the step of compounding said formulation with from about 0.2 to about 2 wt % calcium oxide, based on total formulation.

14. The method of claim 13 wherein the ratio of melt viscosities of said formulation at 10 minutes and 5 minutes (t10/t5) as measured in a Kayeness rheometer at 335° C. and using a shear rate of 400 sec$^{-1}$ is greater than about 0.50.

15. The method of claim 13 wherein said polyphthalamide formulation further comprises from about 10 to about 60 wt % glass fiber, based on total weight of the formulation.

16. The method of claim 13 wherein said polyphthalamide is a copolymer containing at least about 40 mole % recurring aliphatic diamine terephthalamide units having the structure

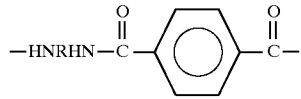

wherein R comprises at least one aliphatic hydrocarbyl radical selected from the group consisting of substituted and unsubstituted aliphatic radicals having from about 2 to about 14 carbon atoms; and recurring aliphatic diamine aliphatic diamide units selected from the group consisting of hexamethylene adipamide, 2-methylpentamethylene adipamide, hexamethylene sebacamide, hexamethylene azeleamide, hexamethylene dodecamethylamide, hexamethylene cyclohexanedicarboxylamide and dodecamethylene adipamide.

17. An injection-molded article comprising the composition of claim 1.

18. An extruded article comprising the composition of claim 1.

* * * * *

UNITED STATES PATENT AND TRADEMARK OFFICE
CERTIFICATE OF CORRECTION

PATENT NO.: 5,773,500
DATED: June 30, 1998
INVENTOR(S): Mark G. Reichman

It is certified that error appears in the above-identified patent and that said Letters Patent is hereby corrected as shown below:

| Col. | Line | |
|---|---|---|
| 8 | 33 | reads "propylene/1-butene copolymer, polyolefm elastomers" should read --propylene/1-butene copolymer, polyolefin elastomers-- |
| 9 | 47 | reads "shear rate of 400 see$^{-1}$ and 335° C." should read --a shear rate of 400 sec$^{-1}$ and 335° C.-- |
| 12 | 67 | reads "While not wishing to be found by a particular theory" should read -- While not wishing to be bound by a particular theory -- |
| 17 | 33 | reads "10.86 wt.% Kraton FG1900X modifier" should read --10.86 wt.% Kraton FG1901X modifier -- |
| 17 | 47 | reads "C9   0.4   ZnO   58   31.7   0.30" should read -- C9   0.4   ZnO   58   31.7   0.80-- |

UNITED STATES PATENT AND TRADEMARK OFFICE
CERTIFICATE OF CORRECTION

PATENT NO.: 5,773,500
DATED: June 30, 1998
INVENTOR(S): Mark G. Reichman

It is certified that error appears in the above-identified patent and that said Letters Patent is hereby corrected as shown below:

| Col. | Line | |
|------|------|---|
| 19 | 34 | reads "0.28 wt.% K2HPO4" should read --0.28 wt.% $K_2HPO_4$-- |

Signed and Sealed this

Twenty-third Day of March, 1999

Attest:

Q. TODD DICKINSON

Attesting Officer     Acting Commissioner of Patents and Trademarks